United States Patent
Tang et al.

(10) Patent No.: US 11,948,625 B2
(45) Date of Patent: Apr. 2, 2024

(54) SYSTEMS ON CHIPS, MEMORY CIRCUITS, AND METHODS FOR ACCESSING DATA IN A MEMORY CIRCUIT DIRECTLY USING A TRANSISTOR-LEVEL OPERATION SIGNAL

(71) Applicant: WINBOND ELECTRONICS CORPORATION, Taichung (TW)

(72) Inventors: Chih-Tung Tang, Zhubei (TW); Chih-Feng Lin, Zhubei (TW)

(73) Assignee: Winbond Electronics Corporation, Taichung (TW)

( * ) Notice: Subject to any disclaimer, the term of this patent is extended or adjusted under 35 U.S.C. 154(b) by 127 days.

(21) Appl. No.: 17/471,073

(22) Filed: Sep. 9, 2021

(65) Prior Publication Data
US 2023/0075351 A1     Mar. 9, 2023

(51) Int. Cl.
| | |
|---|---|
| *G11C 11/4096* | (2006.01) |
| *G11C 11/4074* | (2006.01) |
| *G11C 11/408* | (2006.01) |
| *G11C 11/4093* | (2006.01) |

(52) U.S. Cl.
CPC ...... *G11C 11/4096* (2013.01); *G11C 11/4074* (2013.01); *G11C 11/408* (2013.01); *G11C 11/4093* (2013.01)

(58) Field of Classification Search
CPC ............ G11C 11/4096; G11C 11/4074; G11C 11/408; G11C 11/4093
USPC .................................................. 365/189.011
See application file for complete search history.

(56) References Cited

U.S. PATENT DOCUMENTS

| | | | |
|---|---|---|---|
| 5,790,839 A | 8/1998 | Luk et al. | |
| 6,510,095 B1 * | 1/2003 | Matsuzaki | G11C 7/1078 |
| | | | 365/219 |
| 8,675,419 B2 | 3/2014 | Kajigaya et al. | |
| 8,743,649 B2 * | 6/2014 | Sato | G11C 11/4074 |
| | | | 365/185.23 |
| 9,383,809 B2 | 7/2016 | Chun et al. | |
| 9,864,536 B2 | 1/2018 | Chun et al. | |
| 9,928,924 B2 | 3/2018 | Chun et al. | |
| 11,521,675 B1 * | 12/2022 | Tei | G11C 11/4096 |
| 11,581,281 B2 | 2/2023 | Yu et al. | |
| 2012/0124280 A1 | 5/2012 | Oner | |
| 2012/0326113 A1 * | 12/2012 | Yoneda | H10N 70/026 |
| | | | 257/E45.001 |
| 2023/0215509 A1 * | 7/2023 | Lin | G11C 29/52 |
| | | | 711/221 |

OTHER PUBLICATIONS

K. Sakui and T. Ohba, "High Bandwidth Memory (HBM) and High Bandwidth NAND (HBN) with the Bumpless TSV Technology," *2019 International 3D Systems Integration Conference (3DIC)*, Sendai, Japan, 2019, pp. 1-4, doi: 10.1109/3DIC48104.2019.9058900.

* cited by examiner

*Primary Examiner* — Connie C Yoha
(74) *Attorney, Agent, or Firm* — Finnegan, Henderson, Farabow, Garrett & Dunner, L.L.P.

(57) ABSTRACT

System on chips, memory circuits, and method for data access, the memory circuits including a memory cell array and an input/output (I/O) connection interface coupled to the memory cell array, wherein the I/O connection interface is configured for coupling to an external signal line to directly receive a transistor-level operation signal from an external memory controller for accessing data in the memory cell array.

20 Claims, 9 Drawing Sheets

SYSTEMS ON CHIPS, MEMORY CIRCUITS, AND METHODS FOR ACCESSING DATA IN A MEMORY CIRCUIT DIRECTLY USING A TRANSISTOR-LEVEL OPERATION SIGNAL

TECHNICAL FIELD

The present application relates to memory circuits, and more specifically, to systems on chips, memory circuits, and methods for data access.

BACKGROUND

In integrated circuits, memory circuits provide high-volume memories for data access. In some integrated circuits, one or more memory dies are bonded with a system die in a package for efficient data access. The memory and system dies include conventional input/output interfaces and memory control circuits to communicate with each other. However, as bonding technologies advance to provide efficient electrical communications between the memory and system dies, the conventional input/output interfaces and memory control circuits may adversely affect data access efficiency.

SUMMARY

Embodiments of the present disclosure provide systems on chips, memory circuits, and methods for data access.

These embodiments include a memory circuit. The memory circuit includes a memory cell array and an input/output (I/O) connection interface coupled to the memory cell array. The I/O connection interface is configured for coupling to an external signal line to directly receive a transistor-level operation signal from an external memory controller for accessing data in the memory cell array.

These embodiments also include a method for data access. The method includes receiving a transistor-level operation signal, the transistor-level operation signal corresponding to a read or write operation, receiving a transistor-level address signal, and transmitting or receiving a transistor-level data signal in accordance with the transistor-level operation signal.

These embodiments further include an integrated circuit. The integrated circuit includes a memory circuit including a memory cell array, and a system-on-chip (SoC) circuit coupled to the memory circuit through interconnectors and configured to transmit a transistor-level operation signal and a transistor-level address signal through a first plurality of the interconnectors to the memory circuit, the transistor-level operation signal corresponding to a read or write operation; and transmit to or receive from the memory circuit a transistor-level data signal through a second plurality of the interconnectors.

It is to be understood that the foregoing general description and the following detailed description are exemplary and explanatory only, and are not restrictive of the invention, as claimed.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Figure 1A:
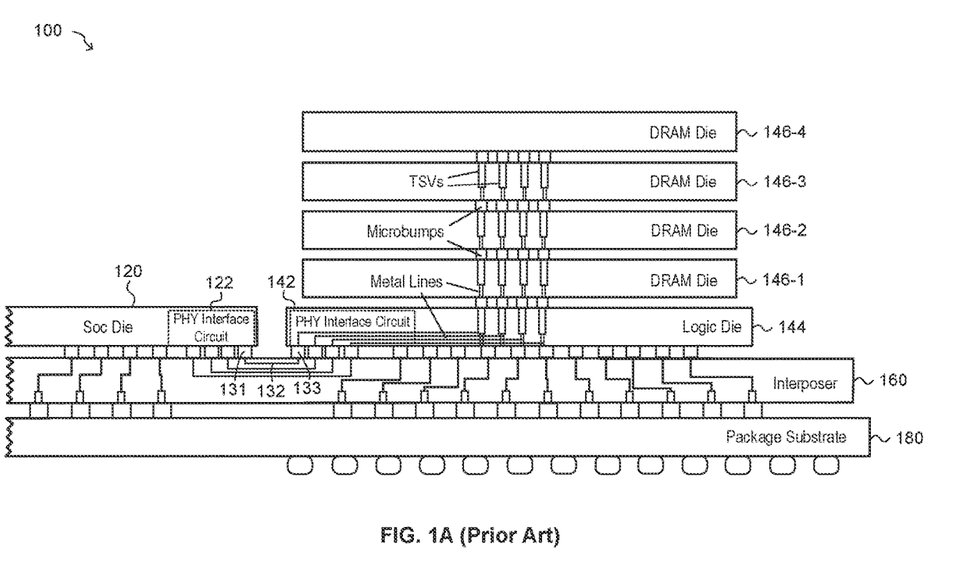
FIG. 1A illustrates a sectional view of a conventional integrated circuit.

FIG. 1A illustrates a sectional view of a conventional integrated circuit 100. Integrated circuit 100 includes an SoC die 120, a logic die 144, dynamic random-access memory (DRAM) dies 146-1, 146-2, 146-3, and 146-4, an interposer 160, and a package substrate 180. Logic die 144 and DRAM dies 146-1, 146-2, 146-3, and 146-4 are interconnected together as a plurality of DRAMs by through-silicon vias (TSVs) (not labeled), microbumps (not labeled), and metal lines (not labeled). SoC die 120 and logic die 144 are interconnected with interposer 160 by microbumps 131 and 133, respectively, and a plurality of microbumps (not labeled). Interposer 160 is also interconnected with package substrate 180 by a plurality of microbumps (not labeled). Interposer 160 includes connection paths from SoC die 120 and logic die 144 to package substrate 180 and interconnection paths between SoC die 120 and logic die 144.

SoC die 120 includes a physical (PHY) interface circuit 122. Logic die 144 includes a physical (PHY) interface circuit 142. PHY interface circuit 122 of SoC die 120 is communicatively coupled to PHY interface circuit 142 of logic die 144 through interposer 160. For example, one of the interconnection paths between PHY interface circuit 122 and PHY interface circuit 142 includes microbump 131, a conductive line 132, and mocrobump 133.

Figure 1B:
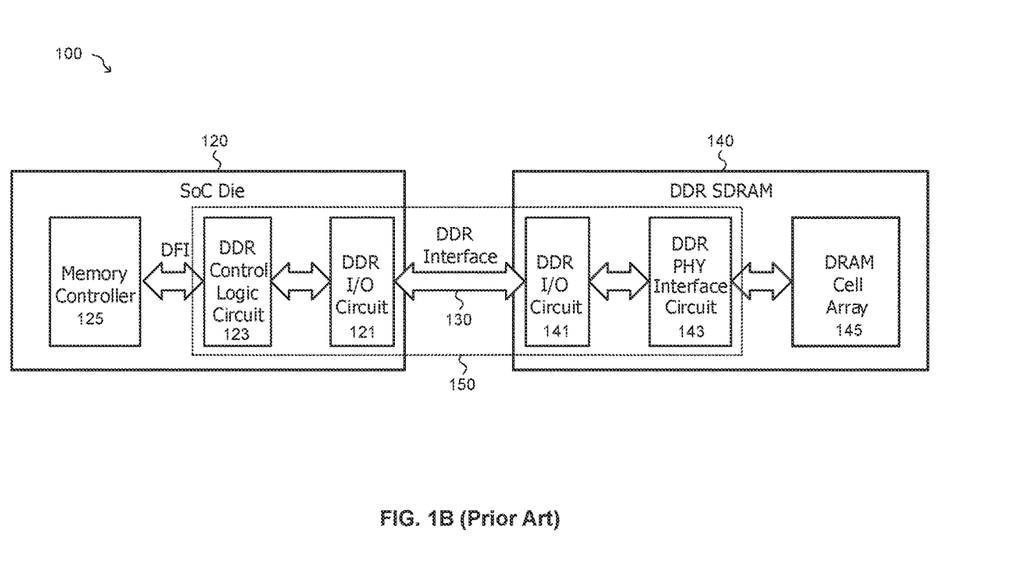
FIG. 1B illustrates a block diagram of a conventional integrated circuit.

FIG. 1B illustrates a block diagram of integrated circuit 100. Integrated circuit 100 includes SoC die 120 and a DDR SDRAM 140. Logic die 144 and DRAM dies 146-1, 146-2, 146-3, and 146-4 (FIG. 1A) are implemented as DDR SDRAM 140 (FIG. 1B). As shown in FIG. 1B, SoC die 120 includes a DDR I/O circuit 121, a DDR control logic circuit 123, and a memory controller 125. Memory controller 125 communicates with DDR control logic circuit 123 via a DDR PHY interface (DFI) for accessing data in DDR SDRAM 140. DDR control logic circuit 123 controls DDR I/O circuit 121 to communicate with DDR SDRAM 140. DDR SDRAM 140 includes a DDR I/O circuit 141, a DDR PHY interface circuit 143, and a DRAM cell array 145. DDR PHY interface circuit 143 is communicatively coupled to DRAM cell array 145 and controls DDR I/O circuit 141 to communicate with SoC die 120. DDR I/O circuit 121 of SoC die 120 and DDR I/O circuit 141 of DDR SDRAM 140 communicate with each other via a DDR interface 130. DDR interface 130 may include, for example, a stub series terminated logic (SSTL) interface.

When SoC die 120 needs to access data in DDR SDRAM 140, memory controller 125 sends control signals to DDR control logic circuit 123 via the DFI. According to the control signals, DDR control logic circuit 123 controls DDR I/O circuit 121 to transmit operation signals, address signals, and/or data signals to DDR I/O circuit 141 of DDR SDRAM 140 via DDR interface 130. DDR PHY interface circuit 143 receives the operation signals, address signals, and/or data signals via DDR I/O circuit 141; decodes the operation signals; and controls DRAM cell array 140 to store data if the operation signals correspond to a write operation, or to provide data, via DDR I/O circuit 141, to SoC die 120 if the operation signals correspond to a read operation. When DDR SDRAM 140 provides the data in the read operation, DDR control logic circuit 123 controls DDR I/O circuit 121 to receive data signals and/or control signals from DDR I/O circuit 141. DDR control logic circuit 123 may notify memory controller 125 of data reception via the DFI.

DDR I/O circuit 121 and DDR I/O circuit 141 drive and/or buffer the operation signals, address signals, data signals, and/or control signals between SoC die 120 and DDR SDRAMs 140 to ensure that the signals are correctly exchanged between the two integrated circuit dies, i.e., SoC die 120 and DDR SDRAM 140. The driving and/or buffering of the signals improve signal strength against interconnection resistance between SoC die 120 and DDR SDRAM 140. For example, as shown in FIG. 1A, PHY interface circuit 122 connects to PHY interface circuit 142 via a plurality of interconnection paths. One of the interconnection paths includes microbump 131, conductive line 132, and mocrobump 133. Microbumps 131 and 133 have high resistances, and the high resistances may result in high interconnection resistance causing resistance/capacitance (RC) delay. DDR I/O circuit 121 and DDR I/O circuit 141 include driving and/or buffering circuits to drive and/or buffer the signals against the high interconnection resistance and RC delay to correctly exchange the signals between SoC die 120 and DDR SDRAM 140.

In integrated circuit 100 (FIG. 1B), memory access circuits 150 includes DDR I/O circuit 121, DDR control logic circuit 123, DDR interface 130, DDR I/O circuit 141, and DDR PHY interface circuit 143. Accordingly, memory access circuits 150 are required in a conventional integrated circuit for data access between integrated circuit chips.

Figure 2:
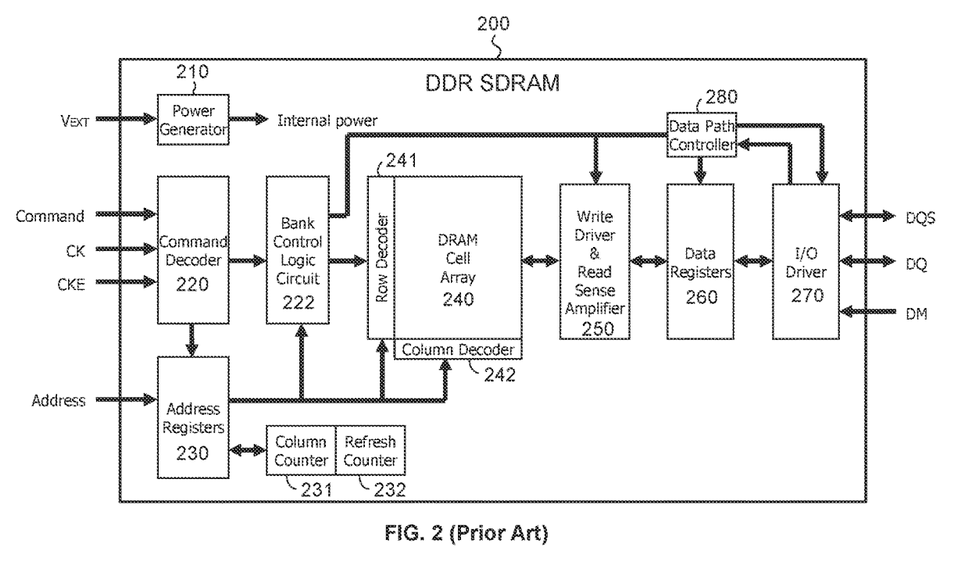
FIG. 2 illustrates a block diagram of a conventional double data rate (DDR) synchronous dynamic random-access memory (SDRAM).

FIG. 2 illustrates a block diagram of a conventional DDR SDRAM 200. DDR SDRAM 200 may be implemented as DDR SDRAM 140 (FIG. 1B). DDR SDRAM 200 includes a power generator 210, a command decoder 220, a bank control logic circuit 222, address registers 230, a column counter 231, a refresh counter 232, a DRAM cell array 240, a row decoder 241, a column decoder 242, a write driver & read sense amplifier 250, data registers 260, an I/O driver 270, and a data path controller 280.

Power generator 210 receives an external power ($V_{EXT}$), generates internal power, and supplies the internal power to other components of DDR SDRAM 200, such as DRAM cell array 240.

Command decoder 220 is configured to receive a command signal (Command), a clock signal (CK), and a clock enable signal (CKE); decode the command signal into bank control signals and address control signals; and transmit the bank control signals to bank control logic circuit 222 and the address control signals to address registers 230.

Address registers 230 are configured to receive input address signals (Address) and the address control signals from command decoder 220; provide address information to bank control logic circuit 222; provide row addresses and column addresses to row decoder 241 and column decoder 242, respectively; and communicate with column counter 231 and refresh counter 232 for column and refresh counting, respectively.

Bank control logic circuit 222 is configured to receive the bank control signals from command decoder 220 and the address information from address registers 230; and provide row address control signals to row decoder 241, data path control signals to data path controller 280, and read/write control signals to write driver & read sense amplifier 250.

Row decoder 241 is configured to receive the row addresses from address registers 230 and the row address control signals from bank control logic circuit 222 and select one or more rows of memory cells in DRAM cell array 240. Column decoder 242 is configured to receive the column addresses from address registers 230 and select one or more columns of memory cells in DRAM cell array 240. DRAM cell array 240 includes a plurality of memory cells arranged in rows and columns. Some of the memory cells are activated for data access based on the selected rows and columns.

If the command signal (Command) indicates a write operation, write driver & read sense amplifier 250 drives data signals from data registers 260 and provides the driven data signals to be stored in the activated memory cells. If the command signal (Command) indicates a read operation, write driver & read sense amplifier 250 senses and amplifies data signals from the activated memory cells and provides the amplified data signals to data registers 260. Data registers 260 hold input data signals from I/O driver 270 for the write operation and the amplified data signals from write driver & read sense amplifier 250 for the read operation.

I/O driver 270 is configured to receive a data bus strobe signal (DQS), input data signals (DQ), and/or a data mask signal (DM) and provide the input data signals to data registers 260 for the write operation; and receive data signals from data registers 260, enhance driving capability of the data signals, and provide the enhanced data signals as output data signals (DQ) to the data bus for the read operation.

Data path controller 280 is configured to communicate with bank control logic circuit 222 and control write driver & read sense amplifier 250, data registers 260, and I/O driver 270 to process data signals for the write and read operations.

In conventional integrated circuit 100, interposer 160 (FIG. 1A) is used to interconnect SoC die 120 and logic die 144. However, incorporating interposer 160 into integrated circuit 100 results in extra cost and increases the package size of integrated circuit 100. Moreover, memory access circuits 150 (FIG. 1B), including DDR I/O circuit 121, DDR control logic circuit 123, DDR interface 130, DDR I/O circuit 141, and DDR PHY interface circuit 143, are used to overcome high resistances and/or RC delay at interconnections between SoC die 120 and DDR SDRAM 140. However, memory access circuits 150 cause additional access latency, consume extra power, and require certain circuit areas in SoC die 120 and DDR SDRAM 140. Memory access circuits 150 therefore increase power consumption and circuit area of integrated circuit 100 and adversely affect data access efficiency. For example, I/O driver 270 (FIG. 2) may have a substantial circuit area and consume significant power. Command decoder 220 (FIG. 2) may increase access latency and consume certain power.

Figure 3:
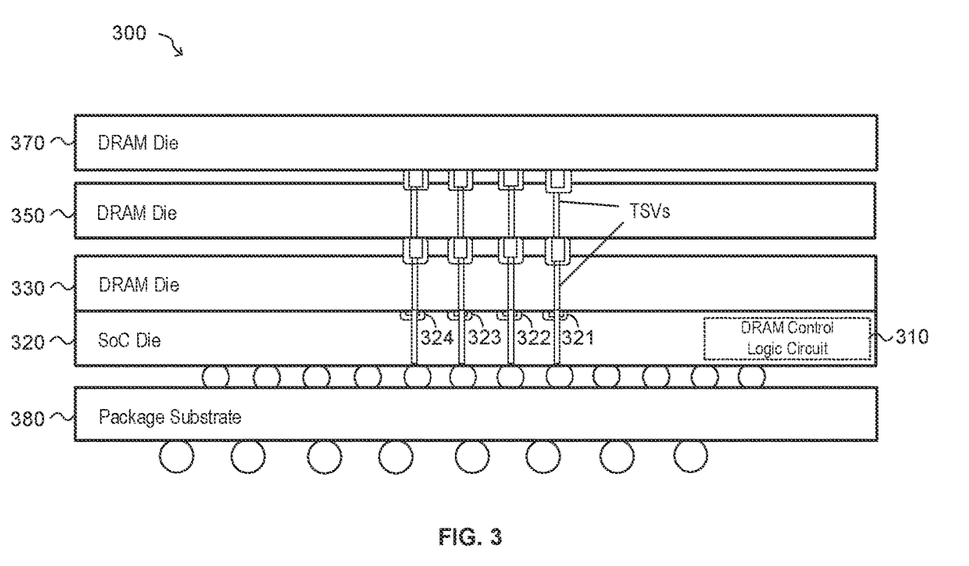
FIG. 3 illustrates a sectional view of an exemplary integrated circuit, including an SoC die and memory dies, according to some embodiments of the present disclosure.

FIG. 3 illustrates a sectional view of an exemplary integrated circuit 300, including an SoC die and memory dies, according to some embodiments of the present disclosure. Integrated circuit 300 includes an SoC die 320, DRAM dies 330, 350, and 370, and a package substrate 380. DRAM dies 330, 350, and 370 are interconnected together as a plurality of DRAMs by TSVs. SoC die 320 is interconnected with DRAM die 330 by a plurality of bumpless interconnectors (not all shown), including bumpless interconnectors 321, 322, 323, and 324, and with package substrate 380 by a plurality of microbump interconnectors (not labeled). The bumpless interconnectors do not include microbumps, and therefore do not have high resistances and do not cause significant RC delay at interconnections between SoC die 320 and DRAM die 330. Thus, SoC die 320 is configured to access data in DRAM dies 330, 350, and 370 by accessing memories on the same die using transistor-level signals.

As used herein, a transistor-level signal is defined as an electrical signal between two transistors at a voltage level and a current level that are sufficient for the two transistors to operate correctly. The transistor-level signal may not be transmitted correctly between conventional integrated circuit chips or dies because of high resistances and/or significant RC delay therebetween.

DRAM dies 330, 350, and 370 of integrated circuit 300 are memory circuits and include memory cell arrays for storing data. SoC die 320 of integrated circuit 300 includes an SoC circuit and is communicatively coupled to the memory circuits in DRAM dies 330, 350, and 370. SoC die 320 may include one or more processing circuits, such as one or more graphical processing units (GPUs), one or more central processing units (CPUs), one or more application-specific integrated circuits (ASICs), and/or any other logic circuits for various applications. SoC die 320 is configured to transmit a transistor-level operation signal and a transistor-level address signal through one or more of the bumpless interconnectors to the memory circuits in DRAM dies 330, 350, and/or 370 for data access.

The transistor-level operation signal corresponds to a read, write, or other memory operation. The transistor-level address signal includes a memory address. If the transistor-level operation signal corresponds to a write operation, the SoC die 320 is configured to transmit, through one or more of the plurality of bumpless interconnectors, including bumpless interconnectors 321, 322, 323, and 324, a transistor-level data signal to a plurality of memory cells at the memory address in the memory circuits of DRAM dies 330, 350, and/or 370. The transistor-level data signal includes data that SoC die 320 intends to write into the memory circuits of DRAM dies 330, 350, and/or 370. If the transistor-level operation signal corresponds to a read operation, the SoC die 320 is configured to receive, through one or more of the plurality of bumpless interconnectors, including bumpless interconnectors 321, 322, 323, and 324, a transistor-level data signal from a plurality of memory cells at the memory address in the memory circuits of DRAM dies 330, 350, and/or 370. The transistor-level data signal includes data that SoC die 320 intends to read from the memory circuits of DRAM dies 330, 350, and/or 370.

In some embodiments, SoC die 320 includes a DRAM control logic circuit 310 configured to transmit the transistor-level operation signal and the transistor-level address signal through one or more of the plurality of bumpless interconnectors, including bumpless interconnectors 321, 322, 323, and 324, to the memory circuits of DRAM dies 330, 350, and/or 370; and transmit to or receive from the memory circuits the transistor-level data signal through one or more of the plurality of bumpless interconnectors, including bumpless interconnectors 321, 322, 323, and 324.

Table 1 illustrates comparison of I/O interface parameters between an exemplary DRAM disclosed herein and Low-Power Double Data Rate (LPDDR) SDRAM, LPDDR 2 (LPDDR2) SDRAM, LPDDR 3 (LPDDR3) SDRAM, and LPDDR 4 (LPDDR4) SDRAM specified by the Joint Electron Device Engineering Council (JEDEC) Solid State Technology Association.

TABLE 1

Comparison of I/O Interfaces

| Memory | I/O Interface | Termination Level | VDDQ (V) | Drive Curr. (mA) | I/O Cap. (pF) | C/A Cap. (pF) |
|---|---|---|---|---|---|---|
| DRAM | CMOS | N/A | 0.6 | 4 | 0.4-0.6 | 0.4-0.6 |
| LPDDR | LVCMOS | VDDQ/2 | 1.8 or 1.2 | 60 | 3-5 | 1.5-3 |
| LPDDR2 | HSUL | VDDQ/2 | 1.2 | 30 | 1.25-2.5 | 1-2 |
| LPDDR3 | HSUL | VDDQ/2 | 1.2 | 30 | 1-1.8 | 0.5-1.1 |
| LPDDR4 | LVSTL | VSSQ | 1.1 or 0.6 | 18 | 0.7-1.3 | 0.5-0.9 |

DRAM dies 330, 350, and/or 370 may be the exemplary DRAM in the first row of Table 1. The DRAM includes a complementary metal-oxide semiconductor (CMOS) interface. The CMOS interface allows an electrical signal between two metal-oxide semiconductor (MOS) transistors at a voltage level and a current level that are sufficient for the two transistors to operate correctly. The voltage level, i.e., the output stage drain power voltage (VDDQ), is 0.6 volt (V). The current level, i.e., the drive current, is 4 milliamps (mA). Data inputs and outputs of the DRAM have an I/O capacitance (I/O Cap.) of 0.4-0.6 picofarad (pF). Control and address inputs of the DRAM have a control/address capacitance (C/A Cap.) of 0.4-0.6 pF. The CMOS interface does not need termination.

The LPDDR includes a low voltage CMOS (LVCMOS) interface. The LVCMOS interface requires a VDDQ of 1.8 or 1.2 V and a drive current of 60 mA. The LVCMOS interface has a data I/O capacitance of 3-5 pF and a C/A capacitance of 1.5-3 pF. The LVCMOS interface requires a termination, and a terminal level of the LVCMOS interface is VDDQ/2. The LPDDR2 and LPDDR3 both include a high speed unterminated logic (HSUL) interface. The HSUL interface requires a VDDQ of 1.2 V and a drive current of 30 mA. The HSUL interface of the LPDDR2 has a data I/O capacitance of 1.25-2.5 pF and a C/A capacitance of 1-2 pF. The HSUL interface of the LPDDR3 has a data I/O capacitance of 1-1.8 pF and a C/A capacitance of 0.5-1.1 pF. The HSUL interface requires a termination, and a terminal level of the HSUL interface is VDDQ/2. The LPDDR4 includes a low voltage swing terminated logic (LVSTL) interface. The LVSTL interface requires a VDDQ of 1.1 or 1.6 V and a drive current of 18 mA. The LVSTL interface has a data I/O capacitance of 0.7-1.3 pF and a C/A capacitance of 0.5-0.9 pF. The LVSTL interface requires a termination, and a terminal level of the LVSTL interface is the output stage source power voltage (VSSQ).

As shown in Table 1, the CMOS interface of the exemplary DRAM requires a lower data I/O capacitance than the LVCMOS interface of the LPDDR, the HSUL interface of the LPDDR2 and LPDDR3, and the LVSTL interface of the LPDDR4. One of reasons for the lower VDDQ is the low resistances of the plurality of bumpless interconnectors between, for example, DRAM die 330 and SoC die 320. Moreover, the CMOS interface of the exemplary DRAM has a lower data I/O capacitance and a lower C/A capacitance than the LVCMOS interface of the LPDDR, the HSUL interface of the LPDDR2 and LPDDR3, and the LVSTL interface of the LPDDR4. As a result, RC delay of an electrical signal (i.e., a signal delay) between, for example, DRAM die 330 and SoC die 320 is smaller than RC delay between, for example, a processor and any of LPDDR, LPDDR2, LPDDR3, and LPDDR4. SoC die 320 can therefore access data in DRAM die 330 as accessing a memory on the same die. The electrical signal between DRAM die 330 and SoC die 320 is similar to an electrical signal between CMOS transistors and therefore defined as the transistor-level signal. In addition, the CMOS interface does not require a termination. Thus, the current consumption of the CMOS interface is much lower than those of the LVCMOS, HSUL, and LVSTL interfaces.

Figure 4:
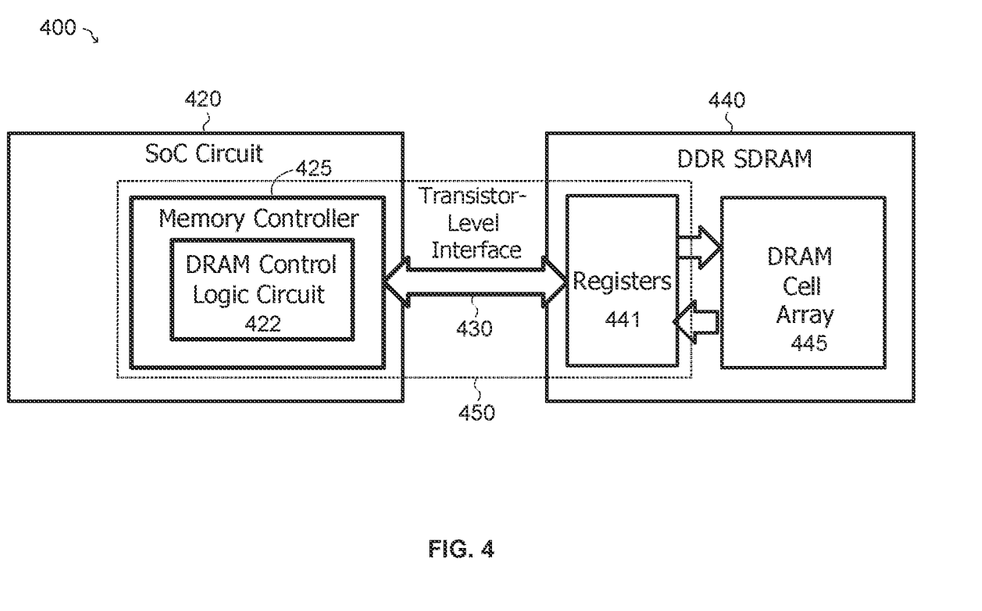
FIG. 4 illustrates a block diagram of an exemplary integrated circuit, including an SoC circuit and a memory circuit, according to some embodiments of the present disclosure.

FIG. 4 illustrates a block diagram of an exemplary integrated circuit 400, including an SoC circuit and a memory circuit, according to some embodiments of the present disclosure. Integrated circuit 400 may be implemented, manufactured, and bonded as integrated circuit 300 (FIG. 3). Integrated circuit 400 includes an SoC circuit 420 and a DDR SDRAM 440. SoC circuit 420 corresponds to SoC die 320. DDR SDRAM 440 corresponds to one or more of DRAM dies 330, 350, and 370. SoC circuit 420 and DDR SDRAM 440 are communicatively coupled with each other through a transistor-level interface 430. Transistor-level interface 430 includes a plurality of interconnectors between SoC circuit 420 and DDR SDRAM 440, such as the plurality of bumpless interconnectors, including bumpless interconnectors 321, 322, 323, and 324 (FIG. 3). SoC circuit 420 includes a memory controller 425. Memory controller 425 includes a DRAM control logic circuit 422. DDR SDRAM 440 includes registers 441 and a DRAM cell array 445.

In some embodiments, memory controller 425 of SoC circuit 420 is configured to transmit a transistor-level operation signal and a transistor-level address signal through one or more of the interconnectors of transistor-level interface 430 to DDR SDRAM 440 for accessing data therein. Memory controller 425 is also configured to transmit to or receive from DDR SDRAM 440 a transistor-level data signal through one or more of the interconnectors of transistor-level interface 430.

When the transistor-level operation signal corresponds to a write operation, registers 441 of DDR SDRAM 440 are configured to directly receive the transistor-level data signal from SoC circuit 420 and hold data carried in the transistor-level data signal. Registers 441 are also configured to provide the data to be written into DRAM cell array 445. DRAM cell array 445 is configured to store the data in accordance with a memory address in the transistor-level address signal.

When the transistor-level operation signal corresponds to a read operation, DRAM cell array 445 is configured to provide data in accordance with a memory address in the transistor-level address signal. Registers 441 are configured to receive and hold the data from DRAM cell array 445. Registers 441 are also configured to directly transmit the data as the transistor-level data signal to SoC circuit 420 through transistor-level interface 430.

In some embodiments, memory controller 425 is configured to communicate with DRAM control logic circuit 422 for accessing data in DDR SDRAM 440. According to the communication with memory controller 425, DRAM control logic circuit 422 is configured to transmit a transistor-level operation signal and a transistor-level address signal through one or more of the interconnectors of transistor-level interface 430 to DDR SDRAM 440. DRAM control logic circuit 422 is also configured to transmit to or receive from DDR SDRAM 440 a transistor-level data signal through one or more of the interconnectors of transistor-level interface 430.

Registers 441 and DRAM cell array 445 are configured to operate similarly to operations described above when memory controller 425 transmits the transistor-level operation signal and the transistor-level address signal.

In integrated circuit 400 (FIG. 4), memory access circuits 450 include memory controller 425, transistor-level interface 430, and registers 441. Memory access circuits 450 are used for data access between SoC circuit 420 and DDR SDRAM 440. As compared with memory access circuits 150 (FIG. 1B), memory access circuits 450 do not include counterparts of DDR I/O circuit 121, DDR control logic circuit 123, DDR I/O circuit 141, and DDR PHY interface circuit 143. SoC circuit 420 is capable of accessing data in DRAM cell array 445 only by memory access circuits 450 because SoC circuit 420 and DDR SDRAM 440 can exchange transistor-level signals. Using memory access circuits 450, rather than memory circuit 150, results in shorter access latency, less power consumption, and smaller physical areas for data access in integrated circuit 400, as compared to conventional integrated circuit 100.

Figure 5:
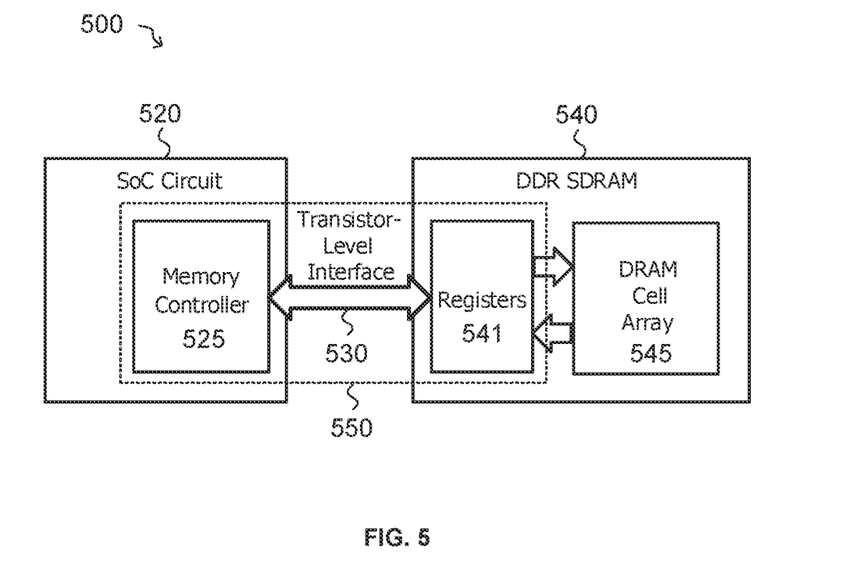
FIG. 5 illustrates a block diagram of an exemplary integrated circuit, including an SoC circuit and a memory circuit, according to some embodiments of the present disclosure.

FIG. 5 illustrates a block diagram of an exemplary integrated circuit 500, including an SoC circuit and a memory circuit, according to some embodiments of the present disclosure. Integrated circuit 500 may be implemented, manufactured, and bonded as integrated circuit 300 (FIG. 3). Integrated circuit 500 includes an SoC circuit 520 and a DDR SDRAM 540. SoC circuit 520 corresponds to SoC die 320. DDR SDRAM 540 corresponds to one or more of DRAM dies 330, 350, and 370. SoC circuit 520 and DDR SDRAM 540 are communicatively coupled with each other through a transistor-level interface 530. Transistor-level interface 530 includes a plurality of interconnectors between SoC circuit 520 and DDR SDRAM 540, such as the plurality of bumpless interconnectors, including bumpless interconnectors 321, 322, 323, and 324 (FIG. 3). SoC circuit 520 includes a memory controller 525. DDR SDRAM 540 includes registers 541 and a DRAM cell array 545.

Memory controller 525 of SoC circuit 520 is configured to transmit a transistor-level operation signal and a transistor-level address signal through one or more of the interconnectors of transistor-level interface 530 to DDR SDRAM 540 for accessing data therein. Memory controller 525 is also configured to transmit to or receive from DDR SDRAM 540 a transistor-level data signal through one or more of the interconnectors of transistor-level interface 530.

Registers 541 and DRAM cell array 545 are configured to operate similarly to operations illustrated above for registers 441 and DRAM cell array 445 with reference to FIG. 4.

In integrated circuit 500 (FIG. 5), memory access circuits 550 include memory controller 525, transistor-level interface 530, and registers 541. Memory access circuits 550 are used for data access between SoC circuit 520 and DDR SDRAM 540. As compared with memory access circuits 150 (FIG. 1B), memory access circuits 550 do not include counterparts of DDR I/O circuit 121, DDR control logic circuit 123, DDR I/O circuit 141, and DDR PHY interface circuit 143. SoC circuit 520 is capable of accessing data in DRAM cell array 545 by only memory access circuits 550 because SoC circuit 520 and DDR SDRAM 540 can exchange transistor-level signals. Using memory access circuits 550, rather than memory circuit 150, results in shorter access latency, less power consumption, and smaller physical areas for data access in integrated circuit 500, as compared to conventional integrated circuit 100.

Figure 6:
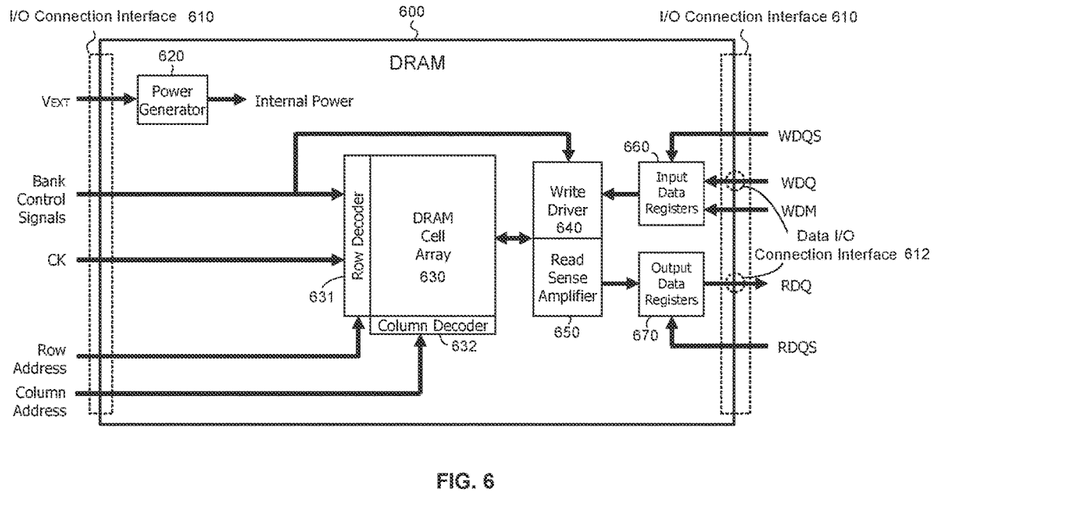
FIG. 6 illustrates a block diagram of an exemplary memory circuit, according to some embodiments of the present disclosure.

FIG. 6 illustrates a block diagram of an exemplary DRAM 600, according to some embodiments of the present disclosure. DRAM 600 may be implemented as DRAM dies 330, 350, and 370 (FIG. 3), DDR SDRAM 440 (FIG. 4), and/or DDR SDRAM 540 (FIG. 5). DRAM 600 includes an I/O connection interface 610, a power generator 620, a DRAM cell array 630, a row decoder 631, a column decoder 632, a write driver 640, a read sense amplifier 650, input data registers 660, and output data registers 670. DRAM cell array 630 corresponds to DRAM cell arrays 445 (FIG. 4) and/or 545 (FIG. 5). Input data registers 660 and/or output data registers 670 correspond to registers 441 (FIG. 4) and/or 541 (FIG. 5).

I/O connection interface 610 includes a plurality of conductive lines configured to receive external power ($V_{EXT}$), bank control signals, a clock signal (CK), a row address signal (Row Address), a column address signal (Column Address), a write data strobe signal (WDQS), a write data signal (WDQ), a write data mask signal (WDM), and a read data strobe signal (RDQS); and transmit a read data signal (RDQ).

I/O connection interface 610 of DRAM 600 is configured for coupling to an external signal line to directly receive a transistor-level operation signal from an external memory controller for accessing data in the memory cell array. For example, when DRAM 600 is implemented as DDR SDRAM 540 (FIG. 5), DRAM cell array 630 corresponds to DRAM cell array 545. I/O connection interface 610 is configured for coupling to a plurality of signal lines (not shown) between DDR SDRAM 540 and SoC circuit 520 to directly receive a transistor-level operation signal from memory controller 525 for accessing data in DRAM cell array 545. The signal lines are a part of transistor-level interface 530 and are therefore external signal lines to DDR SDRAM 540 (i.e., DRAM 600). The transistor-level operation signal from memory controller 525 includes the bank control signals, the write data strobe signal (WDQS), and/or the read data strobe signal (RDQS).

When SoC circuit 520 intends to write data into DDR SDRAM 540 (i.e., DRAM 600), memory controller 525 is configured to transmit the bank control signals for controlling write driver 640 and the write data strobe signal (WDQS) as the transistor-level operation signal to DDR SDRAM 540 (i.e., DRAM 600). Thus, I/O connection interface 610 of DRAM 600 (i.e., DDR SDRAM 540) is configured for coupling to the signal lines of transistor-level interface 530 to directly receive the bank control signals for controlling write driver 640 and the write data strobe signal (WDQS) from memory controller 525 to write data into DRAM cell array 545. As used herein, to directly receive the bank control signals and the write data strobe signal (WDQS) means that these signals from memory controller 525 are received by I/O connection interface 610 without being buffered or strengthened by other circuits.

In some embodiments, the transistor-level operation signal is a complementary metal-oxide semiconductor (CMOS) level signal. For example, as illustrated with reference to FIG. 5, transistor-level interface 530 includes a plurality of interconnectors between SoC circuit 520 and DDR SDRAM 540, such as the plurality of bumpless interconnectors, including bumpless interconnectors 321, 322, 323, and 324 (FIG. 3). The interconnectors of transistor-level interface 530 do not have high resistances and therefore do not cause significant RC delay for interconnections between SoC circuit 520 and DDR SDRAM 540. Thus, memory controller 525 of SoC circuit 520 is configured to transmit the bank control signals, the write data strobe signal (WDQS), and/or the read data strobe signal (RDQS) at a voltage level and/or a current level for communication between transistors, instead of between integrated circuit chips. In some embodiments, SoC circuit 520 and DDR SDRAM 540 each include CMOS circuits. Memory controller 525 is configured to transmit the bank control signals, the write data strobe signal (WDQS), and/or the read data strobe signal (RDQS) at a voltage level and/or with signal strength for communication between the CMOS transistors of SoC circuit 520 and DDR SDRAM 540.

Power generator 620 is configured to receive, via I/O connection interface 610, input power ($V_{EXT}$) from an external power source. Power generator 620 is also configured to generate internal power based on the input power ($V_{EXT}$). Power generator 620 is configured to supply the internal power to DRAM cell array 630 and/or other components of DRAM 600.

In some embodiments, a DRAM does not include a power generator and the DRAM's components are instead supplied with power from one or more external power sources.

DRAM cell array 630 includes a plurality of DRAM cells, i.e., memory cells. The DRAM cells are arranged in rows and columns. Each DRAM cell includes, for example, a capacitor connected by a pass transistor to a column line (or digit line or bit line). The column line is connected to a plurality of DRAM cells arranged in a column. A row line (or word line) is also connected to a plurality of DRAM cells, arranged in a row. The row and column lines of DRAM cells are selected in accordance with a memory address from a memory controller, e.g., memory controller 525.

Row decoder 631 includes a row address decoder (i.e., a decoding circuit) and is coupled to DRAM cell array 630. Row decoder 631 is also coupled to directly receive, via I/O connection interface 610, an externally generated transistor-level row address signal (Row Address). As used herein, to directly receive, via I/O connection interface 610, the transistor-level row address signal means that row decoder 631 receives the transistor-level row address signal (Row Address) input to DRAM 600 via I/O connection interface 610 without signal buffering or enhancement of driving capability. Memory controller 525 (FIG. 5), for example, is configured to generate and transmit the transistor-level row address signal (Row Address) to DDR SDRAM 540 (i.e., DRAM 600). Memory controller 525 is an external circuit to DDR SDRAM 540 (i.e., DRAM 600). After row decoder 631 decodes the transistor-level row address signal (Row Address), row decoder 631 is configured to select one or more of the row lines of DRAM cells in DRAM cell array 630 based on a row address in the transistor level row address signal (Row Address).

Column decoder 632 includes a column address decoder (i.e., a decoding circuit) and is coupled to DRAM cell array 630. Column decoder 631 is also coupled to directly receive, via I/O connection interface 610, an externally generated transistor-level column address signal (Column Address). As used herein, to directly receive, via I/O connection interface 610, the transistor-level column address signal means that column decoder 632 receives the transistor-level column address signal (Column Address) input to DRAM 600 via I/O connection interface 610 without signal buffering or enhancement of driving capability. Memory controller 525 (FIG. 5), for example, is configured to generate and transmit the transistor-level column address signal (Column Address) to DDR SDRAM 540 (i.e., DRAM 600). Memory controller 525 is an external circuit to DDR SDRAM 540 (i.e., DRAM 600). After column decoder 632 decodes the transistor-level column address signal (Column Address), column decoder 632 is configured to select one or more of the column lines of DRAM cells in DRAM cell array 630 based on a column address in the transistor-level column address signal (Column Address).

Write driver 640 includes a write driver circuit coupled between input data registers 660 and DRAM cell array 630. Write driver 640 is configured to drive data signals from input data registers 660 to be written into DRAM cell array 630.

Read sense amplifier 650 includes a read sense amplifier circuit coupled between output data registers 670 and DRAM cell array 630. Read sense amplifier 650 is configured to sense and amplify data signals from DRAM cell array 630 to be held by output data registers 670.

Input data registers 660 include a plurality of data registers configured to hold input data for a write operation. Input data registers 660 are configured to receive, via I/O connection interface 610, a write data strobe signal (WDQS) from an external memory controller and a write data signal (WDQ) from a data bus. Input data registers 660 are configured to hold data in the write data signal (WDQ) based on the write data strobe signal (WDQS). The external memory controller may be, for example, memory controller 525 when DRAM 600 is implemented as DDR SDRAM 540 (FIG. 5). The data bus is, for example, a part of transistor-level interface 530 (FIG. 5) and includes a plurality of data signal lines between DDR SDRAM 540 and SoC circuit 520. The data signal lines may be unidirectional from SoC circuit 520 to DDR SDRAM 540, or bidirectional between DDR SDRAM 540 and SoC circuit 520.

Output data registers 670 includes a plurality of data registers configured to hold output data for a read operation. Output data registers 670 are configured to receive, via I/O connection interface 610, a read data strobe signal (RDQS) from an external memory controller. Output data registers 670 are also configured to hold data from read sense amplifier 650 and provide the data to I/O connection interface 610 for transmitting to a data bus based on the read data strobe signal (RDQS). I/O connection interface 610 is configured to transmit a read data signal (RDQ) including the data on the data bus. The external memory controller may be, for example, memory controller 525 when DRAM 600 is implemented as DDR SDRAM 540 (FIG. 5). The data bus is, for example, transistor-level interface 530 (FIG. 5) and includes a plurality of data signal lines between DDR SDRAM 540 and SoC circuit 520. The data signal lines may be unidirectional from DDR SDRAM 540 to SoC circuit 520, or bidirectional between DDR SDRAM 540 and SoC circuit 520.

The data signal lines for the write data signal (WDQ) and the data signal lines for the read data signal (RDQ) are both included in transistor-level interface 530 (FIG. 5) and are therefore external signal lines to DDR SDRAM 540 (i.e., DRAM 600).

In some embodiments, the bidirectional data signal lines for the write data signal (WDQ) are the same as the bidirectional data signal lines for the read data signal (RDQ). Alternatively, the bidirectional data lines for the write data signal (WDQ) are different from the bidirectional data lines for the read data signal (RDQ).

In some embodiments, DRAM 600 receives a transistor-level operation signal, including a read or write operation signal. DRAM 600 includes a plurality of registers coupled between DRAM cell array 630 and I/O connection interface 610 from which to directly transmit or to directly receive data signals according to the read or write operation signal, respectively. For example, I/O connection interface 610 of DRAM 600 is configured to receive the bank control signals for controlling write driver 640 or read sense amplifier 650 as transistor-level operation signals, including a read or write operation signal. DRAM 600 includes input data registers 660 and output data registers 670 coupled between DRAM cell array 630 and I/O connection interface 610 to directly receive or from which to directly transmit data signals according to the write or read operation signal in the bank control signals.

In some embodiments, I/O connection interface 610 of DRAM 600 includes a data I/O connection interface configured to transmit or receive a transistor-level data signal. As shown in FIG. 6, I/O connection interface 610 includes a data I/O connection interface 612. Data I/O connection interface 612 includes a plurality of conductive lines configured to receive the write data signal (WDQ) and output the read data signal (RDQ). The write data signal (WDQ) and read data signal (RDQ) are both transistor-level data signals when DRAM 600 is implemented as DRAM die 330, as illustrated above with reference to FIG. 3. The write data signal (WDQ) includes a plurality of input data. The read data signal (RDQ) includes a plurality of output data. DRAM 600 includes input data registers 660 and output data registers 670 coupled between DRAM cell array 630 and I/O connection interface 610 and hold the input data in the write data signal (WDQ) or the output data in the read data signal (RDQ).

In some embodiments, I/O connection interface 610 is configured to conduct the transistor-level operation signal through I/O connection interface 610 without signal buffering or enhancement of driving capability. For example, as shown in FIG. 6, I/O connection interface 610 is configured to conduct the bank control signals, the write data strobe signal (WDQS), and/or the read data strobe signal (RDQS) through I/O connection interface 610 without signal buffering or enhancement of driving capability. I/O connection interface 610 does not include buffers or drivers.

In some embodiments, the external signal line includes a plurality of signal lines. I/O connection interface 610 includes a plurality of connectors for connecting to the plurality of signal lines. A distance between adjacent ones of the connectors is equal to or less than ten micrometers and greater than or equal to 4.5 micrometers. For example, when DRAM 600 is implemented as DRAM die 330 (FIG. 3), a plurality of conductive lines (not shown) of SoC die 320 are connected, via a plurality of bumpless interconnectors, to a plurality of conductive lines (not shown) of DRAM die 330. The conductive lines of SoC die 320 are external signal lines to DRAM die 330. I/O connection interface 610 of DRAM 600 (i.e., DRAM die 330) is configured for coupling to the conductive lines of SoC die 320 to directly receive the bank control signals, the write data strobe signal (WDQS), and/or the read data strobe signal (RDQS) from SoC die 320. I/O connection interface 610 includes a plurality of connectors, such as terminals of the conductive lines of DRAM die 330 (i.e., DRAM 600), for connecting to the conductive lines of SoC die 320.

A minimal distance between adjacent ones of the connectors would be determined according to a size of interconnectors between an SoC die and a DRAM die and a semiconductor process. For example, conventional standard C4 bumps have a size of 100 micrometers (μm), and a bump pitch for the standard C4 bumps is 150-200 μm. A minimum distance between adjacent ones of the connectors of the DRAM die is therefore 150 μm. The distance herein is a center-to-center distance between the adjacent ones of the connectors of the DRAM die. As another example, conventional micro C4 bumps have a size of 20-30 μm, and a bump pitch for the micro C4 bumps is 30-60 μm. A minimum distance between adjacent ones of the connectors of the DRAM die is 30 μm.

The bumpless interconnectors between SoC die 320 and DRAM die 330 have a size of, e.g., 5, 3, or 2 μm, and a pitch for the bumpless interconnectors is 10 μm or less than 10 μm. When a technology node of semiconductor processing scales down, a size of bumpless interconnectors also scales down. A pitch for the bumpless interconnectors therefore also scales down. A minimum distance between adjacent ones of the connectors would be about 9 μm in an exemplary seven nanometer (7 nm) semiconductor process. A minimum distance between adjacent ones of the connectors would be about 6 μm in an exemplary five nanometer (5 nm) semiconductor process. A minimum distance between adjacent ones of the connectors would be 4.5 μm in an exemplary three nanometer (3 nm) semiconductor process. In some embodiments, a distance between adjacent ones of the connectors may be greater than the minimum distance. For example, a distance between adjacent ones of the connectors of DRAM die 330 in a 3 nm semiconductor process may be 4.5-6 μm or even a greater distance. As another example, a distance between adjacent ones of the connectors of DRAM die 330 in a 5 nm semiconductor process may be 6-9 μm or even a greater distance. As another example, a distance between adjacent ones of the connectors of DRAM die 330 in a 7 nm semiconductor process may be 9-10 μm or even a greater distance. As mentioned above, the distance herein is a center-to-center distance between the adjacent ones of the connectors of the DRAM die.

When SoC circuit 520 intends to read data from DDR SDRAM 540 (i.e., DRAM 600), memory controller 525 is configured to transmit the bank control signals for controlling read sense amplifier 650 and the read data strobe signal (RDQS) as the transistor-level operation signal to DDR SDRAM 540 (i.e., DRAM 600). Thus, I/O connection interface 610 of DRAM 600 (i.e., DDR SDRAM 540) is configured for coupling to the signal lines of transistor-level interface 530 to directly receive the bank control signals for controlling read sense amplifier 650 and the read data strobe signal (RDQS) from memory controller 525 for reading data in DRAM cell array 545.

As compared with conventional DDR SDRAM 200 (FIG. 2), DRAM 600 does not include counterparts of command decoder 220, bank control logic circuit 222, address registers 230, and I/O driver 270. Without these circuits, DRAM 600 provides more efficient data access, consumes less power, and requires smaller circuit area, as compared to conventional DDR SDRAM 200.

Figure 7:
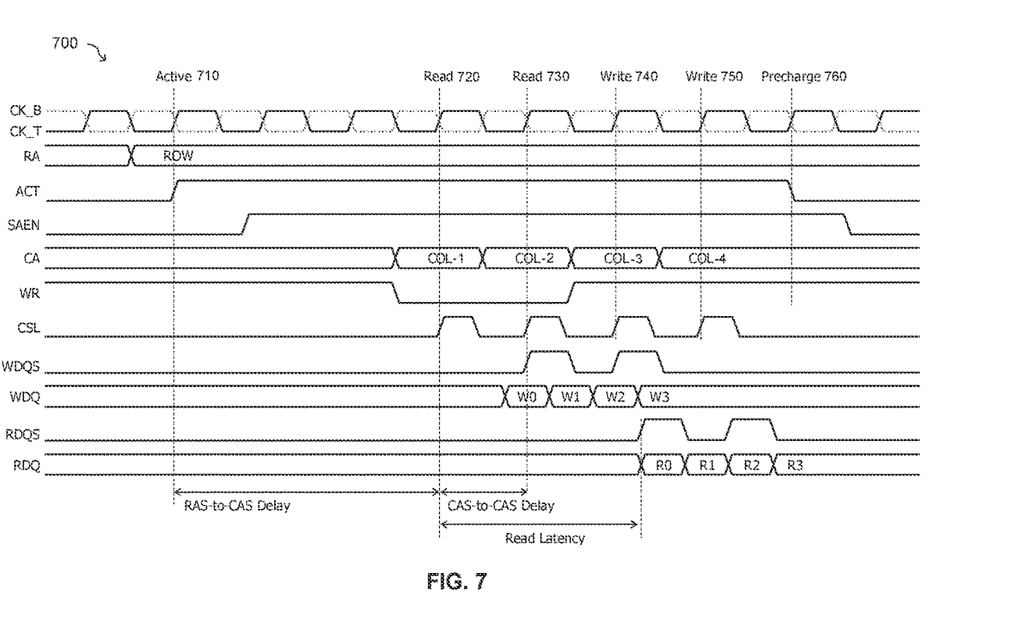
FIG. 7 is an exemplary timing diagram of an exemplary memory circuit, according to some embodiments of the present disclosure.

FIG. 7 is an exemplary timing diagram 700 of an exemplary memory circuit, according to some embodiments of the present disclosure. Timing diagram 700 may be a timing diagram of DRAM 600. Timing diagram 700 includes a first clock signal (CK_T), a second clock signal (CK_B), a row address signal (RA), an active signal (ACT), a sense amplifier enable signal (SAEN), a column address signal (CA), a write control signal (WR), a column select line signal (CSL), a write data strobe signal (WDQS), a write data signal (WDQ), a read data strobe signal (RDQS), and a read data signal (RDQ). When DRAM 600 is implemented as, for example, DDR SDRAM 540, memory controller 525 is configured to transmit or control SoC circuit 520 to transmit these signals to DRAM 600 (i.e., DDR SDRAM 540), except the read data signal (RDQ).

The first clock signal (CK_T) and the second clock signal (CK_B) are differential clock signals and have reversed phases. One or both of the clock signals (CK_T and CK_B) correspond to the clock signal (CK) of DRAM 600 (FIG. 6). The row address signal (RA) and the column address signal (CA) correspond to the row address signal (Row Address) and the column address signal (Column Address) of DRAM 600 (FIG. 6), respectively. The active signal (ACT), sense amplifier enable signal (SAEN), write control signal (WR), and column select line signal (CSL) correspond to the bank control signals of DRAM 600 (FIG. 6). The write data strobe signal (WDQS), write data signal (WDQ), read data strobe signal (RDQS), and read data signal (RDQ) corresponds to the write data strobe signal (WDQS), write data signal (WDQ), read data strobe signal (RDQS), and read data signal (RDQ) of DRAM 600 (FIG. 6), respectively.

DRAM 600 is configured to perform Active 710, Read 720, Read 730, Write 740, Write 750, and Precharge 760 operations. When the active signal (ACT) transits from a low level to a high level and stays at the high level, DRAM 600 is activated (i.e., Active 710 operation), and row decoder 631 is configured to decode a row address (ROW) from the row address signal (RA). Within one clock cycle, the sense amplifier enable signal (SAEN) also transits from a low level to a high level and stays at the high level. The sense amplifier enable signal (SAEN) at the high level enables write driver 640 and/or read sense amplifier 650 for write and/or read operations.

After a row address strobe (RAS) to column address strobe (CAS) delay (RAS-to-CAS delay), a first column address (COL-1) is provided in the column address signal (CA) and the column select line signal (CSL) is activated for performing Read 720 operation. Column decoder 632 is configured to decode the column address (COL-1) in the column address signal (CA) based on the column select line signal (CSL). Read sense amplifier 650 is configured to sense and amplify data signals in DRAM cell array 630 based on the row address (ROW) and the column address (COL-1) and provide the data signals to output data registers 670. After a read latency, the read data strobe signal (RDQS) is activated and DRAM 600 is configured to transmit data R0 and R1 in the read data signal (RDQ).

After a CAS-to-CAS delay, a second column address (COL-2) is provided in the column address signal (CA) and the column select line signal (CSL) is activated for performing Read 730 operation. Similar to Read 710 operation, after a read latency delay, the read data strobe signal (RDQS) is activated and DRAM 600 is configured to transmit data R2 and R3 in the read data signal (RDQ).

One clock cycle before Write 740 operation, the write data signal (WDQ) includes data W0 and W1. The write data strobe signal is activated to trigger input data registers 660 to hold data W0 and W1. When a third column address (COL-3) is provided in the column address signal (CA) and the column select line signal (CSL) is activated for performing Write 730 operation, write driver 640 is configured to write data W0 and W1 into DRAM cell array 630.

DRAM 600 is configured to perform Write 750 operation to write data W2 and W3 into DRAM cell array 630 based on the row address and a column address (COL-4) by similar steps illustrated above for Write 740 operation.

After Write 750 operation, memory controller 525 is configured to transit the active signal (ACT) from the high level to a low level. DRAM 600 is configured to perform Precharge 760 operation to charge one or more banks of DRAM cell array 630.

Figure 8:
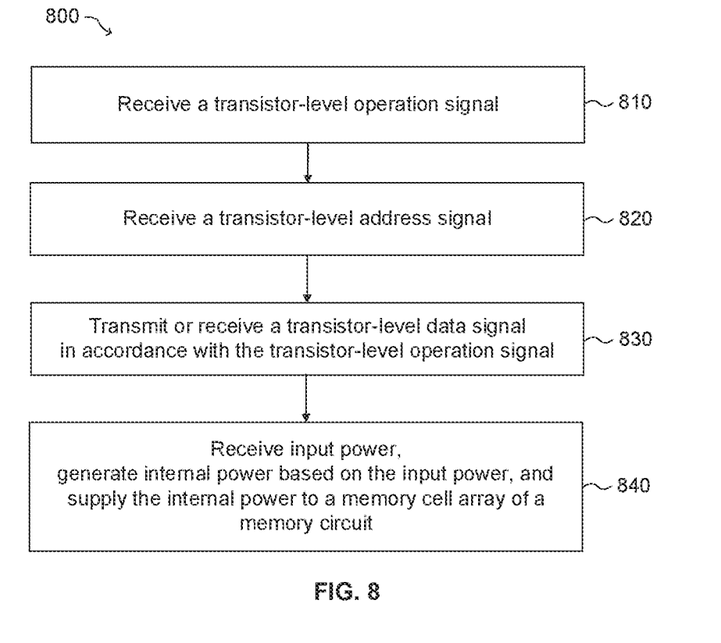
FIG. 8 is a flow chart of an exemplary method for data access in an exemplary memory circuit, according to some embodiments of the present disclosure.

FIG. 8 is a flow chart of an exemplary method 800 for data access in an exemplary memory circuit, according to some embodiments of the present disclosure. Method 800 may be practiced by DRAM dies 330, 350, and 370, DDR SDRM 440, DDR SDRAM 540, DRAM 600, and/or other memory circuits. Method 800 includes receiving a transistor-level operation signal (step 810); receiving a transistor-level address signal (step 820); transmitting or receiving a transistor-level data signal in accordance with the transistor-level operation signal (step 830); and receiving input power from a power source, generating internal power based on the input power, and supplying the internal power to a memory cell array of a memory circuit (step 840).

Step 810 includes receiving a transistor-level operation signal. For example, when DRAM 600 (FIG. 6) is implemented as DDR SDRAM 540 (FIG. 5), I/O connection interface 610 of DRAM 600 is configured to directly receive a transistor-level operation signal from memory controller 525 of SoC circuit 520 for accessing data in DRAM cell array 545. The transistor-level operation signal from memory controller 525 includes the bank control signals, the write data strobe signal (WDQS), and/or the read data strobe signal (RDQS). A transistor-level operation signal, including the bank control signals for controlling write driver 640 and the write data strobe signal (WDQS), indicates a write operation. A transistor-level operation signal, including the bank control signals for controlling read sense amplifier 650 and the read data strobe signal (RDQS), indicates a read operation.

Step 820 includes receiving a transistor-level address signal. For example, when DRAM 600 (FIG. 6) is implemented as DDR SDRAM 540 (FIG. 5), I/O connection interface 610 of DRAM 600 is configured to receive a transistor-level row address signal (Row Address) and a transistor-level column address signal (Column Address) from memory controller 525 of SoC circuit 520 for accessing data in DRAM cell array 545.

Step 830 includes transmitting or receiving a transistor-level data signal in accordance with the transistor-level operation signal. For example, when DRAM 600 (FIG. 6) is implemented as DDR SDRAM 540 (FIG. 5), I/O connection interface 610 of DRAM 600 is configured to transmit a transistor-level data signal (RDQ) to SoC circuit 520 when the transistor-level operation signal from memory controller 525 includes the bank control signals for controlling read sense amplifier 650 and the read data strobe signal (RDQS). Alternatively, I/O connection interface 610 of DRAM 600 is configured to receive a transistor-level data signal (WDQ) from SoC circuit 520 when the transistor-level operation signal from memory controller 525 includes the bank control signals for controlling write driver 640 and the write data strobe signal (WDQS).

Step 840 includes receiving input power from a power source, generating internal power based on the input power, and supplying the internal power to a memory cell array of a memory circuit. For example, power generator 620 of DRAM 600 (FIG. 6) is configured to receive, via I/O connection interface 610, input power ($V_{EXT}$) from an external power source. Power generator 620 is also configured to generate internal power based on the input power ($V_{EXT}$). Power generator 620 is configured to supply the internal power to DRAM cell array 630 and/or other components of DRAM 600.

In some embodiments, the transistor-level operation signal in step 810 is a CMOS level signal. For example, SoC circuit 520 and DDR SDRAM 540 may each include CMOS circuits. Memory controller 525 of SoC circuit 520 is configured to transmit the bank control signals, the write data strobe signal (WDQS), and/or the read data strobe signal (RDQS) as the transistor-level operation signal at a voltage level and/or a current level for communications between the CMOS transistors of SoC circuit 520 and DDR SDRAM 540.

In some embodiment, receiving the transistor-level operation signal of step 810 includes receiving a read strobe signal or a write strobe signal. For example, when DRAM 600 (FIG. 6) is implemented as DDR SDRAM 540 (FIG. 5), I/O connection interface 610 of DRAM 600 is configured to receive bank control signals, a write data strobe signal (WDQS), and/or a read data strobe signal (RDQS) as a transistor-level operation signal. A transistor-level operation signal, including the write data strobe signal (WDQS), indicates a write operation. A transistor-level operation signal, including the read data strobe signal (RDQS), indicates a read operation.

In some embodiments, receiving the transistor-level data signal of step 830 includes directly receiving a first transistor-level data signal into a plurality of first registers of a memory circuit, and transmitting the transistor-level data signal of step 830 includes directly transmitting a second transistor-level data signal from a plurality of second registers of the memory circuit. For example, DRAM 600 (FIG. 6) is configured to directly receive a transistor-level write data signal (WDQ) into input data registers 660 of DRAM 600 from a data bus, e.g., transistor-level interface 530 or 430, in a write operation. As another example, DRAM 600 (FIG. 6) is configured to directly transmit a transistor-level read data signal (RDQ) from output data registers 670 of DRAM 600 to a data bus, e.g., transistor-level interface 530 or 430, in a read operation.

In some embodiments, the transistor-level data signal in step 830 is directly transmitted from or directly received into a plurality of registers of a memory circuit without signal buffering or enhancement of driving capability. For example, data I/O connection interface 612 of DRAM 600 (FIG. 6) does not include any buffers or drivers. In a read operation, DRAM 600 is configured to directly transmitted a transistor-level read data signal (RDQ) from output data registers 670 via data I/O connection interface 612 without signal buffering or enhancement of driving capability. In a write operation, DRAM 600 is configured to directly receive a transistor-level write data signal (WDQ) into input data registers 660 via data I/O connection interface 612 without signal buffering or enhancement of driving capability.

In some embodiments, receiving the transistor-level address signal of step 820 includes receiving a transistor-level row address signal and receiving a transistor-level column address signal. For example, when DRAM 600 (FIG. 6) is implemented as DDR SDRAM 540 (FIG. 5), I/O connection interface 610 of DRAM 600 is configured to receive a transistor-level row address signal (Row Address) and a transistor-level column address signal (Column Address) from memory controller 525 of SoC circuit 520 for accessing data in DRAM cell array 545.

In some embodiments, the memory circuits disclosed herein may include any appropriate type of mass storage provided to store any type of information, such as a volatile or non-volatile, magnetic, semiconductor, optical, removable, non-removable, or other type of storage device or tangible (i.e., non-transitory) computer-readable medium including, but not limited to, a read-only memory (ROM), a flash memory, a dynamic random-access memory (RAM), and a static RAM.

It will be apparent to those skilled in the art that various modifications and variations can be made to the disclosed systems on chips, memory circuits, and methods for data access. Other embodiments will be apparent to those skilled in the art from consideration of the specification and practice of the disclosed systems on chips, memory circuits, and methods for data access. It is intended that the specification and examples be considered as exemplary only, with a true scope being indicated by the following claims and their equivalents.

What is claimed is:

1. A memory circuit on a first die, comprising:
a memory cell array on the first die; and
an input/output (I/O) connection interface coupled to the memory cell array,
wherein the I/O connection interface is configured for coupling to an external signal line to directly receive a transistor-level operation signal from an external memory controller, on a second die, for accessing data in the memory cell array, the transistor-level operation signal being received by a transistor of the memory circuit on the first die as a communication from a transistor of the external memory controller on the second die.

2. The memory circuit of claim 1, wherein the transistor-level operation signal is a complementary metal oxide semiconductor (CMOS) level signal.

3. The memory circuit of claim 1, wherein:
the transistor-level operation signal comprises a read or write operation signal;
the memory circuit further comprising a plurality of registers coupled between the memory cell array and the I/O connection interface to directly transmit or receive data signals according to the read or write operation signal, respectively.

4. The memory circuit of claim 1, wherein the I/O connection interface comprises:
a data I/O connection interface configured to transmit or receive a transistor-level data signal.

5. The memory circuit of claim 4, further comprising:
a plurality of registers coupled between the memory cell array and the data I/O connection interface,
wherein:
the transistor-level data signal comprises a plurality of data; and
the registers are configured to hold the data.

6. The memory circuit of claim 1, further comprising:
a row address decoder coupled to the memory cell array; and
a column address decoder coupled to the memory cell array,
wherein:
the row address decoder is coupled to directly receive, via the I/O connection interface, an externally generated transistor-level row address signal;
the column address decoder is coupled to directly receive, via the I/O connection interface, an externally generated transistor-level column address signal.

7. The memory circuit of claim 1, further comprising:
a power generator configured to:
receive, via the I/O connection interface, input power from an external power source;
generate internal power based on the input power; and
supply the internal power to the memory cell array.

8. The memory circuit of claim 1, further comprising:
a plurality of first data registers on the first die and configured to hold input data for a write operation;
a plurality of second data registers on the first die and configured to hold output data for a read operation;
a write driver circuit coupled between the first data registers and the memory cell array, and configured to drive first data signals from the first data registers to be written into the memory cell array; and
a read sense amplifier circuit coupled between the second data registers and the memory cell array, and configured to sense and amplify second data signals from the memory cell array to be held by the second data registers,
wherein:
the external signal line comprises a first data signal line and a second data signal line;
the first data registers on the first die are configured to receive, via the I/O connection interface, a write strobe signal from the external memory controller on the second die, and receive the input data from the first data signal line; and
the second data registers on the first die are configured to receive, via the I/O connection interface, a read strobe signal from the external memory controller on the second die, and provide the output data based on the read strobe signal to the second data signal line.

9. The memory circuit of claim 1, wherein the I/O connection interface is configured to conduct the transistor-level operation signal through the I/O connection interface without signal buffering or enhancement of driving capability.

10. The memory circuit of claim 1, wherein:
the external signal line comprises a plurality of signal lines; and
the I/O connection interface comprises a plurality of connectors for connecting to the plurality of signal lines, wherein a distance between adjacent ones of the connectors is equal to or less than ten micrometers and greater than or equal to 4.5 micrometers.

11. A method for data access, the method comprising:
receiving, by a memory circuit on a first die, a transistor-level operation signal from a memory controller on a second die, the transistor-level operation signal corresponding to a read or write operation and being received by a transistor of the memory circuit on the first die as a communication from a transistor of the memory controller on the second die;

receiving, by the memory circuit on the first die, a transistor-level address signal from the memory controller on the second die; and transmitting or receiving, by the memory circuit on the first die, a transistor-level data signal in accordance with the transistor-level operation signal and the transistor-level address signal.

12. The method of claim 11, wherein the transistor-level operation signal is a complementary metal oxide semiconductor (CMOS) level signal.

13. The method of claim 11, wherein receiving, by the memory circuit on the first die, the transistor-level operation signal comprises receiving a read strobe signal or a write strobe signal.

14. The method of claim 11, wherein:
receiving the transistor-level data signal comprises directly receiving a first transistor-level data signal into a plurality of first registers of the memory circuit; and
transmitting the transistor-level data signal comprises directly transmitting a second transistor-level data signal from a plurality of second registers of the memory circuit.

15. The method of claim 11, wherein the transistor-level data signal is directly transmitted from or directly received into a plurality of registers of the memory circuit without signal buffering or enhancement of driving capability.

16. The method of claim 11, wherein receiving, by the memory circuit on the first die, the transistor-level address signal comprises:
receiving a transistor-level row address signal; and
receiving a transistor-level column address signal.

17. The method of claim 11, further comprising:
receiving, by the memory circuit on the first die, input power from a power source;
generating, by the memory circuit on the first die, internal power based on the input power; and
supplying the internal power to a memory cell array of the memory circuit.

18. An integrated circuit, comprising:
a memory circuit comprising a memory cell array on a first die; and
a system-on-chip (SoC) circuit on a second die, coupled to the memory circuit through interconnectors, and configured to:
transmit a transistor-level operation signal and a transistor-level address signal through a first plurality of the interconnectors to the memory circuit on the first die, the transistor-level operation signal corresponding to a read or write operation and being transmitted for communication from a transistor of the SoC circuit on the second die to a transistor of the memory circuit on the first die; and
transmit to or receive from the memory circuit on the first die a transistor-level data signal through a second plurality of the interconnectors.

19. The integrated circuit of claim 18, wherein the SoC circuit comprises a memory controller configured to:
transmit the transistor-level operation signal and the transistor-level address signal through the first plurality of the interconnectors to the memory circuit.

20. The integrated circuit of claim 18, wherein the SoC circuit comprises a memory controller and the memory controller comprises a memory control logic circuit, wherein:
the memory controller is configured to communicate with the memory control logic circuit through a double data rate physical interface circuit; and
the memory control logic circuit is configured to transmit the transistor-level operation signal and the transistor-level address signal through the first plurality of the interconnectors to the memory circuit.

* * * * *